United States Patent [19]

Rush

[11] Patent Number: 4,991,221

[45] Date of Patent: Feb. 5, 1991

[54] ACTIVE SPEAKER SYSTEM AND COMPONENTS THEREFOR

[76] Inventor: James M. Rush, 1555 Mesa Verde Dr. E., Costa Mesa, Calif. 92626

[21] Appl. No.: 337,621

[22] Filed: Apr. 13, 1989

[51] Int. Cl.[5] .............................................. H03F 21/00

[52] U.S. Cl. .................................... 381/120; 381/100; 381/90; 381/110; 330/264

[58] Field of Search ............... 381/118, 100, 188, 186, 381/110, 205, 88, 89, 90, 87, 98, 103; 181/199, 144; 330/264

[56] References Cited

U.S. PATENT DOCUMENTS

| | | | |
|---|---|---|---|
| 4,085,646 | 4/1978 | Naumann | 381/118 |
| 4,137,510 | 1/1979 | Iwahara | 381/100 |
| 4,219,099 | 8/1980 | Sacks | 181/144 |
| 4,230,907 | 10/1980 | Hasselbach et al. | 381/188 |
| 4,379,951 | 4/1983 | Gabr | 381/186 |
| 4,452,333 | 6/1984 | Peavey et al. | 181/199 |
| 4,464,634 | 8/1984 | Velazquez | 330/264 |
| 4,483,016 | 11/1984 | Hochstein et al. | 330/264 |
| 4,525,857 | 6/1985 | Orban | 381/100 |
| 4,583,245 | 4/1986 | Gelow et al. | 381/100 |
| 4,599,576 | 7/1986 | Yoshida et al. | 330/264 |
| 4,625,328 | 11/1986 | Freadman | 381/87 |
| 4,630,164 | 12/1986 | Olsson | 330/264 |
| 4,765,580 | 8/1988 | Wright | 381/205 |
| 4,797,630 | 1/1989 | Brown | 330/264 |
| 4,809,339 | 2/1989 | Shih et al. | 381/110 |
| 4,811,403 | 3/1989 | Henricksen | 381/87 |

OTHER PUBLICATIONS

Radio Shack 1986, Catalog, p. 21, (40–1259), and p. 22, (40–1377).

*Primary Examiner*—Forester W. Isen
*Attorney, Agent, or Firm*—Price, Gess & Ubell

[57] ABSTRACT

A biamplified speaker system wherein each speaker enclosure contains amplifiers and an electronic crossover network is powered by its own power supply. A preamplified audio signal is fed to each speaker enclosure for reproduction by a tweeter and a pair of bass drivers. The power amplifiers receive their frequency band of equalized signals from the electronic crossover. The power amplifiers utilize a MOSFET power output stage with the MOSFETs bolted directly to the heat sinks. One power amplifier drives the tweeter, another drives the woofer. The electronic crossover utilizes a modified 24-dB/oct design to divide up the preamplified signal into the frequency bands to be supplied to the tweeter and bass drivers, as well as to compensate for the characteristics of the drivers, in order to provide a flat frequency response curve for the entire speaker.

27 Claims, 4 Drawing Sheets

ACTIVE SPEAKER SYSTEM AND COMPONENTS THEREFOR

BACKGROUND OF THE INVENTION

1. Field of the Invention

The present invention relates generally to improvements in audio speaker systems and, more particularly, pertains to new improved active speaker systems which utilize electronic crossovers and separate amplifiers to drive the tweeter and woofer drivers.

2. Description of Related Art

The most common home audio loud speaker system today is the two-way system employing a base (woofer) and treble (tweeter) driver. In this system, the output from an external power amplifier is supplied to a passive crossover network which separates the high and low frequencies, supplying the mid and low frequencies to the woofer and the high frequencies to the tweeter. There are many shortcomings to this type of passive two-way speaker system, not the least of which is the requirement of a very powerful external power amplifier.

Attempts have been made at designing and producing active systems which are multiamplified systems wherein each transducing or driver element or set of elements is driven by a dedicated power amplifier, the input to which is shaped by a low-level crossover assembly. These systems have traditionally been used in very high and semicustom installations or in professional applications. The main advantage of such multiamplification systems are that the loud speaker system can be more thoroughly designed. The result is, it performs substantially better, especially in the areas of resolution, detail dynamics and efficiency. This concept of biamplifying has not taken hold in the home market. It is a tricky business for a user, since it involves a lot of hardware. For example, for a simple system, two or more power amplifiers, an electronic crossover, and a wealth of cables are required. In the process of choosing these items and setting the whole thing up, fatal flaws can be introduced.

The idea behind a total active loud speaker was to eliminate these problems. The loud speaker is itself powered. These loud speakers are multiamplified. An electronic crossover provides the signals to separate amplifiers matched to each driver's frequency range within that loud speaker enclosure. The electronics are integrated into the overall physical design of the speaker system. This type of approach gives the designer control over all the parameters, allowing him the freedom to enhance the product in many ways. For example, improving bass response, user features, compatibility with the preamplifier, and styling.

Unfortunately, attempts at providing a biamplified speaker design for home use have been unsuccessful in the past due to a variety of reasons, not the least of which is the cost of the speaker system, as well as failure to design a "complete" system. The problem is that the acoustic engineer, the one who designs the housing for the tweeters and woofers and knows all about the transducers, has very little knowledge or desire to acquire knowledge about the electronics, the amplification and electronic crossover circuits.

The present active speaker system is an illustration of the benefits that can be derived from the marriage of these two disciplines into one cohesive whole. The result is a speaker system that is equal to the reproduction quality of professional systems at a price that is below the system prices the homeowner has presently been paying for modular audio systems.

SUMMARY OF THE INVENTION

Each speaker enclosure contains at least a pair of amplifiers and an electronic crossover network along with the audio drivers. The drivers are a tweeter and a pair of eight-inch cones for midrange and bass reproduction The line level signal (approximately 1 volt) is supplied to the electronic crossover network, which routes the high frequencies to the tweeter and the rest of the signal to the woofers. These signals are custom equalized to the drivers and power amplifiers to provide a flat overall response curve. The power amplifiers utilize MOSFET output stages with the MOSFET devices bolted directly to the heat sinks. The electronic crossover network utilizes a plurality of state variable filters along with frequency compensation circuits selected to complement the drivers.

BRIEF DESCRIPTION OF THE DRAWINGS

The objects and many of the attendant advantages of this invention will be readily appreciated as the same becomes better understood by reference to the following detailed description, when considered in conjunction with the accompanying drawings, in which like reference numerals designate like parts throughout the figures, and wherein.

DESCRIPTION OF THE PREFERRED EMBODIMENTS

Background Discussion

Figure 1:
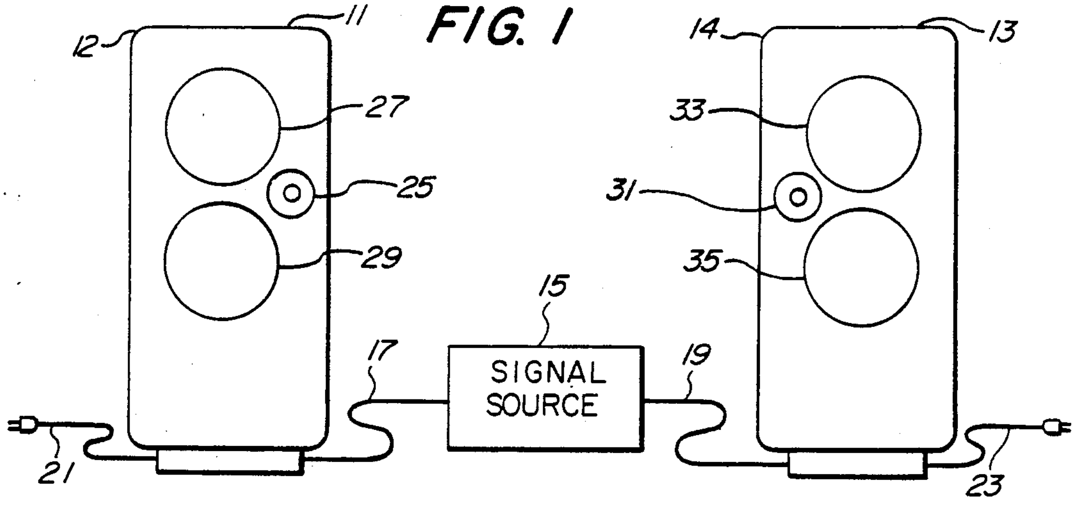
FIG. 1 is a block diagram of the components of a biamplified speaker system according to the present invention.

One of the more important advantages of the biamplified speaker of the present invention is that it exhibits a much greater damping factor than that possible in passive speaker systems. The damping factor being discussed here is electromagnetic damping. Such damping takes place because the moving coil of the transducer and magnet assembly will act as a generator. At times the coil and cone assembly will move in a way that is not in accordance with the signal from the amplifier. This generates a current which is fed back into the driving amplifier. This current breaks the motion of the driver and prevents the amplifier from controlling the movement of the coil and the cone.

Electronic damping enhances the performance of all drivers by reducing cone resonance effects, as well as by reducing spurious responses. At low frequencies damping is almost always an essential part of the alignment of the system. This type of damping factor is defined as the ratio of $R_S/R_O$, where $R_O$ is the amplifier output plus speaker wire plus crossover impedance, and $R_S$ is the impedance of the speaker. The biamplified speaker of the present invention exhibits an extremely high damping factor because the overall design provides a very short speaker wire, thereby lessening impedance in the wire. The amplifiers are stable without the use of an output inductor, thereby reducing the amplifier's output impedance at high frequencies. In addition, all fuses for the tweeter are within the feedback loop, thereby further reducing the amplifier output impedance. Because there are no inductors with their associated resistance in the path between the woofer and the power amplifier, damping at low frequencies approaches the theoretical maximum. The result of these design parameters gives the amplifier of the present invention excellent control over the speaker.

Another highly desirable characteristic of the present invention is the ability to equalize the system, taking into consideration the driver abnormalities. The advantage to such custom equalization at low frequencies in the electronic crossover network solves excursion problems and allows almost a full octave more bass out of the speaker enclosure than a comparable unequalized system. Low frequency equalization is never attempted by a speaker designer using a passive crossover because of the large components required and the problem of interaction with impedance changes near the speaker and vent resonances.

Besides custom equalization, utilization of the electronic crossover system of the present invention allows for time alignment through the use of an all-pass filter (a filter that only effects the time delay of the signal). The delay characteristics of woofers and tweeters can be matched and corrections for phase anomalies can be accomplished.

The overall system approach of the present invention allows for each amplifier to be designed to match the exact load it will work into. Thus the amplifier designed for driving the tweeter does not need huge current capacity. A single output transistor may be used in this case. There is an added advantage in that the single output transistor may be run at a higher bias without overheating its heat sink. By using a higher bias, the amplifier will remain in Class A operation throughout a larger portion of its output swing, thereby effectively eliminating crossover distortion.

The bass amplifier need not be biased as high because crossover distortion typically is only a problem at high frequencies. This allows multiple transistors to run much cooler, thereby extending the life of the amplifier.

The present invention eliminates the use of the standard output inductor utilized with most power amplifiers. Instead, the power amplifier of the present invention drives a dome tweeter through a short piece of speaker wire. This creates an inductive load at high frequencies. By eliminating the inductor in series with the output of the power amplifier, a very high damping factor is obtained, far into the ultrasonic region, improving transient response and increasing suppression of voice coil resonances.

The enclosure for the speakers of the present invention is a reflex enclosure having a port located near the top of the enclosure. According to the design of the speaker system, the motion of air from the port pumps heat out of the enclosure, thereby reducing the amplifier heat sink temperature.

Because the amplifier is located within the speaker enclosure effectively inaccessible to the home user, the shock hazard of an output device in direct contact with the heat sink is effectively removed. The present invention contemplates the direct mounting of the power output devices on the heat sink for maximum thermal transfer. It has been discovered that the thermal resistance from junction to ambient will be reduced approximately 40% by use of this technique. This is an important factor because lowering the temperature of a silicon output transistor junction by 20° C. has been shown to increase the mean time before failure by approximately 50%. Because the electronics are effectively inaccessible to the home user, no extensive protection circuitry is needed. Protection circuitry often degrades the performance of amplifiers and even makes them difficult to service.

In the present invention, the distance between speaker and amplifier output can be as little as one foot. This reduced speaker wire length considerably enhances the sound. In addition, because there are no common wires between the woofer and the tweeter, interaction between them is eliminated. Furthermore, because neither amplifier of the two amplifiers in a speaker enclosure is required to amplify both low and high frequencies simultaneously, intermodulation distortion is greatly reduced.

The system of the present invention satisfies a variety of design goals, not the least of which is to provide the most realistic sounding speaker possible within the price range of the average audiophile. This has been accomplished by a speaker that provides a flat frequency response with a wide dispersion and low distortion at high levels. The speaker of the present invention is a full range speaker in that it has excellent full frequency reproduction capabilities. As a result of its equalized reflex design, it is capable of a −3 dB frequency of 29 Hertz. At the other end of the spectrum, it exhibits excellent high frequency response as the result of the high frequency equalizer.

The speaker of the present invention can also play loud with reliability. Moreover, the speaker of the present invention has a construction which will last for many years due to the innovative amplifier design which substantially reduces thermal stress. Perhaps most important of all, the design of the present speaker system produces an accurate speaker, one that sounds real. Although the sound of the speaker may be simply a matter of taste, it is undeniable that the greatest enjoyment and musical excitement are produced by approaching as closely as possible accurate reproduction of the original music. The speaker of the present invention does this well.

Referring now to FIG. 1, an audio system utilizing the speakers of the present invention is illustrated as comprising a left speaker 13 and a right speaker 11, each being driven by respective left and right channel signals on lines 19 and 17 emanating from a line-level signal source 15. Each speaker is separately powered by way of power cord 23 for left speaker 13 and power cord 21 for right speaker 11. Speakers 11, 13 are mirror image pairs. Each speaker enclosure has a plurality of drivers, none of which are located in the exact center of its cabinet. The right speaker 11 has a tweeter 25 and a pair of 8-inch woofers 27, 29 offset as shown. Loud speaker enclosure 13 has a tweeter 31 and a pair of 8-inch woofers 33, 35 offset as shown.

Each speaker enclosure weighs approximately 83 pounds. This provides an excellent stable platform for the drivers. Many portions of the cabinet are 1½ inches thick in order to help suppress resonances. The cabinet has smooth, rounded corners 12, 14 and an overlapping grill (not shown) that make a minimum diffraction path for the tweeter. The grill cloth is held at an angle with respect to the baffle board, thereby preventing grill reflection from being concentrated at any one specific frequency. An aluminum plate damping system (FIG. 7) is used inside the cabinet to damp panel resonances and strengthen the cabinet. The cabinet structure described allows for tighter packaging of the drivers and weakens the strength of any diffracted waves.

The tweeter pair 25, 31 utilized in the speakers of the present invention are preferably Dynaudio D28 AF tweeters. These tweeters have the ability to play loudly without compressing dynamics of percussive transients. They are smooth and nonfatiguing and exhibit exceptionally low distortion while having good dispersion. In its unequalized form, the tweeter has a response falloff by several decibels between 12 and 20 kHz and a short peak centered about 16 kHz. The 16-kHz peak is removed by acoustical damping. The falloff is compensated for by gentle equalization in order to equalize the power response of this tweeter beyond 20 kHz.

The low frequency drivers 27, 29, 33, 35 are preferably 8-inch Dynaudio woofers. These drivers exhibit exceptionally smooth frequency response and low distortion. They also have very good dispersion of higher frequencies. The dispersion of high frequencies is very important in a two-way design because it helps to maintain uniform power of response. The 3-inch voice coil of these drivers helps to suppress resonances in the cone in two important ways. First, it adds mechanical rigidity, and second, it applies electromechanical damping over a large area of the cone.

The driver configuration of the speaker according to the present invention does not employ a midrange driver in order not to harm the performance of the speaker system illustrated. The human ear has amazing ability to detect small broadband level changes caused by the resonance of midrange enclosures, (less than 0.5 dB over two octaves or more).

Phase cancellation is always present when two drivers are radiating the same frequency in the same area. This is what happens at a crossover point. Because the ears are not exactly the same distance from both drivers, it is possible that a wave compression from one driver will arrive at your ear at the same time a rarefaction from another driver arrives, causing a decrease in the sound at that angle and frequency. The audible effect of these cancellations is to create an uneven dispersion pattern. This problem is minimized in the present invention in four ways: (1) by avoiding as many crossover points as possible; (2) by not having crossover points at high frequencies; (3) by having a steep slope crossover; and (4) by keeping the drivers as close together as possible. By adhering to all four of these design rules in the speaker according to the present invention, the resulting speaker exhibits exceptional imaging (the perception of instrument location).

Figure 2:
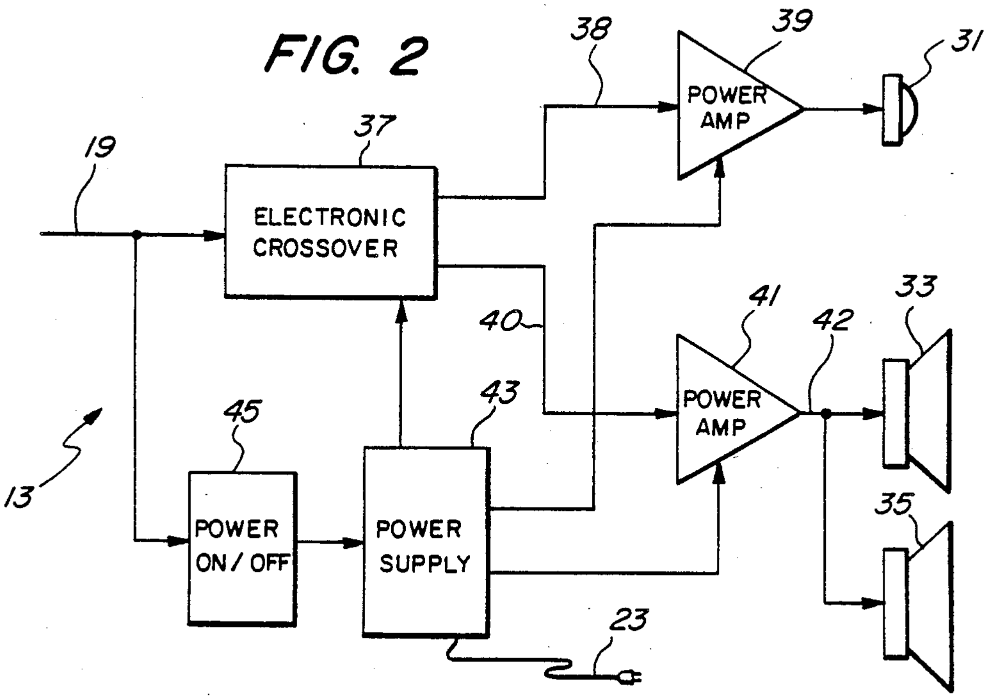
FIG. 2 is a block diagram of a biamplified speaker in the system of FIG. 1.

Referring now to FIG. 2, the electronics and drivers of a single speaker 13 is illustrated diagrammatically. The system comprises a power supply 43 that is driven by house current through power cord 23. Power supply 43 supplies power to the two power amplifiers 39, 41 and the electronic crossover 37. Power supply 43 is turned on by a power on/off switch 45, which is triggered to an on state when a preamplifier output signal is received on line 19.

The electronic crossover circuitry 37, which will be described in more detail hereinafter, receives the input signal on line 19 and divides the signal according to frequency, supplying the higher frequency band over line 38 to high frequency power amplifier 39, and the remaining frequency band over line 40 to low frequency power amplifier 41. High frequency power amplifier 39 drives the tweeter 31. Low frequency power amplifier 41 drives the two 8-inch woofers 33, 35.

Figure 5:
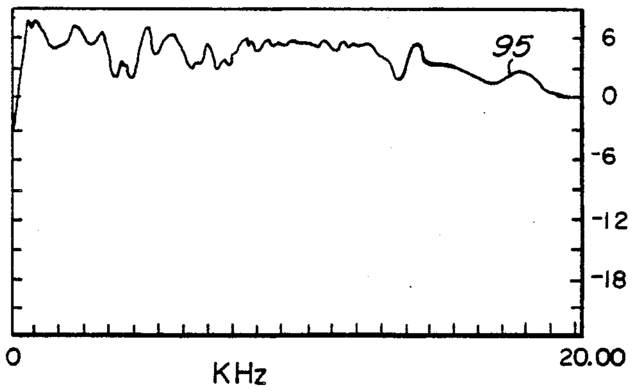
FIG. 5 is the frequency response curve for a biamplified speaker designed according to the present invention.

The electronic crossover is designed specifically to the characteristics of the tweeter 31 and woofer pair 33, 35 in order to provide the overall flat frequency response characteristic 95 (FIG. 5). (The frequency response was measured with a laboratory microphone under an echoic conditions using Fast Fourier Transform technique).

Electronic crossover 37 is basically a modified 24 dB/octave design using state variable filters which is similar to a Linkwitz Riley design, but modified to incorporate and compensate for the amplitude and phase characteristics of the drivers used. The operational amplifiers utilized in the electronic crossover circuitry 37 are preferably LM833 amplifiers. These are specifically designed for audio use and offer an excellent combination of low distortion, low noise, and phase margin. Another desirable characteristic of the LM833 operational amplifier is its behavior at power-up and power-down. During power-up transitions, no large swings are observed at the output. This allows absolute direct coupling of the system all the way to the tweeters.

The power amplifier pair 39, 41 utilized in each speaker enclosure are designed to be an integral part of the whole. The amplifier is completely direct coupled. It utilizes no capacitors to block DC. This function is accomplished in the electronic crossover 37. The amplifiers do not utilize an output inductor because of the very short speaker leads and good amplifier stability. As already noted, this feature provides a greatly increased high frequency damping factor.

The bulk of the voltage gain required is obtained from a very high performance operational amplifier with excellent audio performance. Both the driver and the output stages are fully complementary. Peak output currents in excess of 50 amps are available. Since the amplifier uses no protection circuitry, it will never current limit. The use of the Class AB design with relatively high bias driving efficient loud speakers causes the amplifier to operate in its Class A mode with less than 0.01% distortion during most normal listening, and always below 0.02%.

The use of MOSFET power outputs in the amplifier design, as will be more fully explained hereinafter, offers several well-known advantages over bipolar configurations. Some of these advantages are: (1) increased thermal stability, (2) increased reliability, (3) superior high frequency characteristics, (4) decreased drive power requirements, and (5) simplified paralleling of outputs. The MOSFETs require much less thermal feedback to maintain a constant bias current. This greatly simplifies bias circuit design and prevents audible changes that sometimes occur as an amplifier heats up or cools down. The MOSFET outputs bring increased reliability to the entire amplifier because of their lack of secondary breakdown. The long life of the outputs is also assured due to the tendency of the MOSFET channel to spread out hot spots, preventing transistor fatigue over time.

Because the MOSFET has superior high frequency characteristics, it allows the power amplifier of the present invention to be built with a wider bandwidth, higher damping factor at high frequencies, and higher slew rates, not to mention much greater stability. The result is the following performance specification:

slew rate 130 V $\mu$s damping factor >300 within 20 Hz to 20 kHz into 8 ohms bandwidth >150 kHz stability 0% square wave overshoot distortion <0.02% within a range of 20 Hz to 20 kHz, 8 $\Omega$ load signal-to-noise ratio >100 dB unweighted.

The decreased drive power requirements of the MOSFET allows the use of smaller driver transistors without heat sinks to drive the output stages. These transistors have superior high frequency characteristics, are physically small, and allow a much tighter circuit layout. Multiple output stages implemented in MOSFET can be easily paralleled because no ballasting resistors are needed. Thereby no power is wasted in them.

Figure 3:
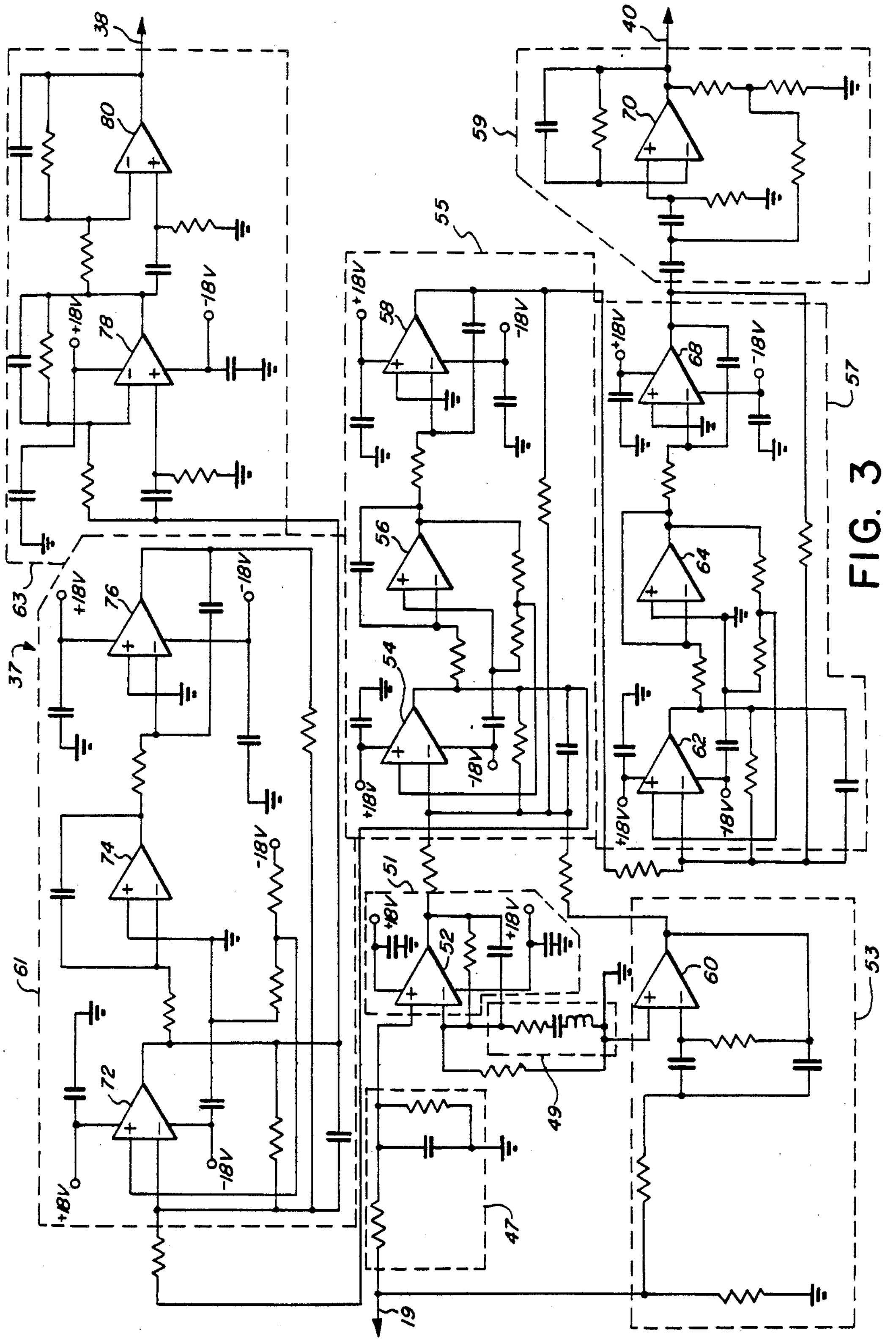
FIG. 3 is a schematic illustration of the electronic crossover of FIG. 2.

Electronic crossover circuitry 37 is schematically illustrated in FIG. 3. The signal from a preamplifier (not shown) is supplied to the crossover circuitry 37 on line 19. The output of the crossover circuitry is supplied on line 38 to the high frequency amplifier and over line 40 to the low frequency amplifier. The heart of the circuitry consists of three state variable active filter networks. State variable filter network 57 acts as a low pass filter having a 12-dB per octave characteristic. State variable filter 55 acts as a high and low pass filter having a 12-dB per octave characteristic. State variable filter 61 acts as a high pass filter having a 12-dB per octave characteristic, giving a overall 24-db/oct characteristic to both skirts.

The signal to be processed is received on line 19 and supplied to a passive low pass filter circuit 47. The output of low pass filter circuit 47 is supplied to the gain stage 51, which is centered around an LM833 operational amplifier 52. At one input a high frequency equalizing circuit 49 is connected thereto. The high frequency equalizing circuit 49 is provided for the purpose of compensating the tweeter characteristics. Also connected to the gain stage 51 is a peak cancelling circuit 53 utilizing an LM833 operational amplifier 60. The peak cancelling circuit is used only in those situations where the drivers exhibit undesirable peak characteristics within the frequency band that need to be compensated for.

The output of the gain stage 51 is supplied to the first state variable filter 55, which is a high pass 12 dB per octave filter. It utilizes three operational amplifiers of the LM833 type, amplifiers 54, 56 and 58. The output of filter 55, at operational amplifier 54, is supplied to state variable filter 61, which is the second high pass filter. A second output of filter 55 is supplied to the second state variable filter stage 57 at the input of the first operational amplifier 62.

This filter stage is a low pass 12 dB per octave filter. This filter again utilizes three stages of LM833 operational amplifiers 62, 64 and 68. The output of low pass filter stage 57 is supplied to a bass equalizer stage 59, which again uses an LM833-type operational amplifier 70.

The base equalizer circuit is basically a second order high pass filter having a 12 dB per octave characteristic, with 6 dB of rise around cutoff. The output on line 40 of the bass equalizer stage 59 produces a frequency characteristic that ranges from less than 25 Hz to approximately 2000 Hz with very steep skirts.

The first stage output of the first state variable filter 55 is supplied to state variable filter 61 at its first stage operational amplifier 72. This filter has three LM833-type operational amplifiers 72, 74 and 76. It functions as a high pass filter with a 12 dB per octave characteristic. The output of this filter is supplied to an all pass time correction circuit 63, which utilizes a pair of LM833 operational amplifiers 78, 80.

This time correction circuit introduces a time delay of 147 microseconds at 2 kHz. The output of the all pass filter circuit 63 on line 38 is the high frequency signal to the tweeter amplifier. The signal has very steep skirts, starts at approximately 2000 Hz and ranges up to over 20,000 Hz.

Figure 4:
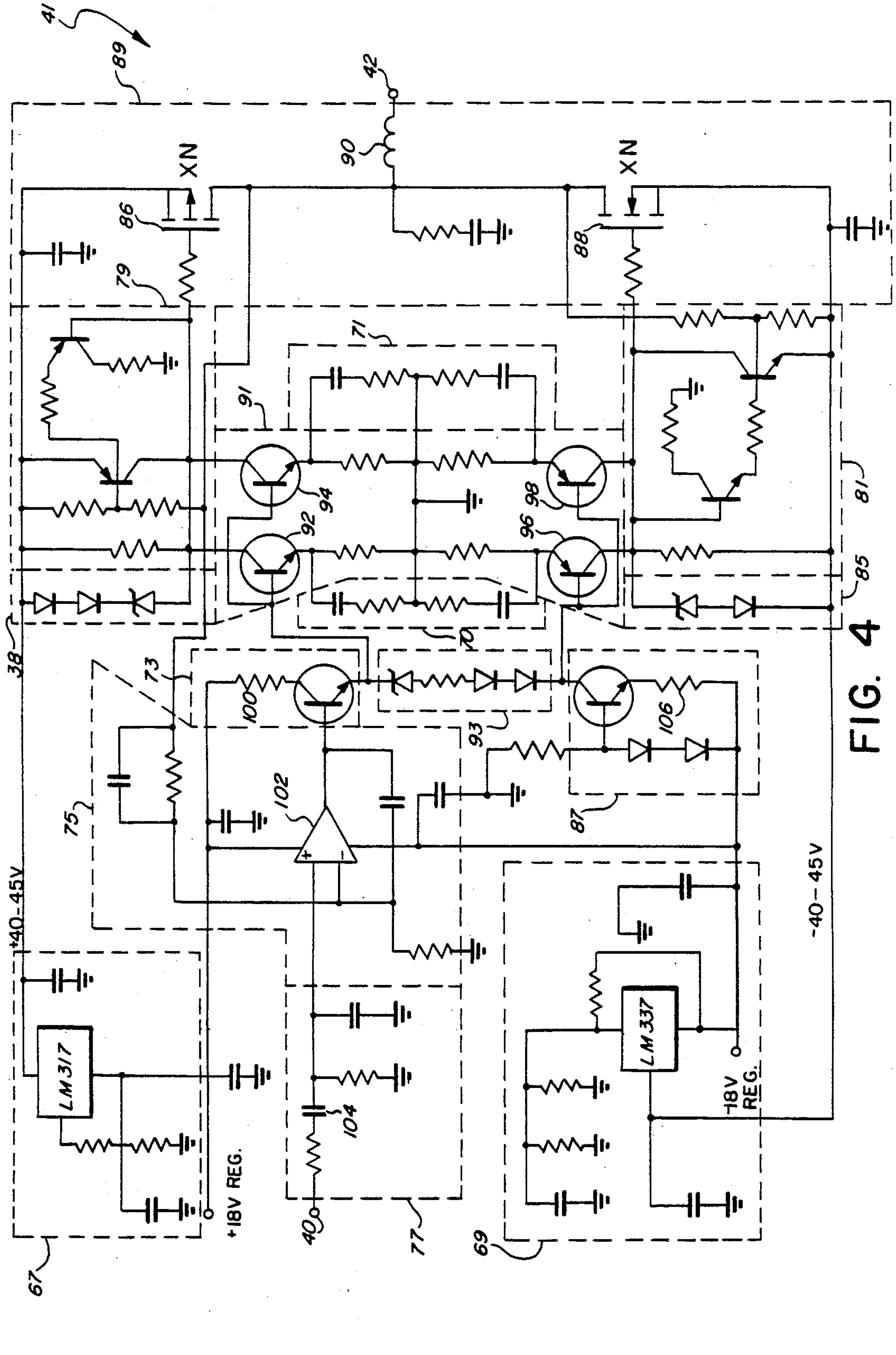
FIG. 4 is, a schematic illustration of one of the power amplifiers of FIG. 2.

The pair of power amplifiers 39, 41 are located in each speaker enclosure. The schematic for amplifier 41 is shown in FIG. 4. The power amplifier utilizes an output stage 89 that has complementary power MOSFETs 86, 88 in a voltage gain configuration, i.e., drain output. The devices may be paralleled with a 100-ohm resistor on each gate.

Particularly significant is the fact that these devices need not be insulated from their heat sink, thereby allowing maximum thermal transfer. The output inductor 90, which may be about 5 microhenries, is optional and is only needed when driving a capacitance load that is greater than 0.1 microfarad. This output stage is highly efficient and allows an output swing from rail to rail.

The output driver stage 91 has four MPS8099 transistors 92, 94, 96 and 98. These are high quality, small signal devices that need not be heat sunk, when the supply rails to these transistors are less than $\pm$50 volts. These output drivers serve as a level shifter and a low impedance driver for the output stage 89.

The biasing voltage and thermal compensation for the output stage 89 is supplied by biasing diodes 93.

The amplifier 41 utilizes a positive 18 volt regulator section 67 which provides 18 volts for the amplifier and crossover network with maximum ripple rejection. The amplifier 41 utilizes a negative 18 volt regulator 69 that provides the amplifier and the crossover with a negative voltage with maximum ripple rejection.

Connected to the output stage 89 are a pair of transconductance equalizer sections 79 and 81. These equalizers reduce distortion by increasing the gain of the output stage at high frequencies. This decreases the operational amplifier output swing. These sections respectively match the gain of the P and N channel MOSFETs 70, 71 to compensate for their unequal transconductances.

Amplifier 41 also utilizes a buffer circuit 73 having a transistor 100 therein that provides a light load to the operational amplifier output, thereby preserving its gain bandwidth. This section also provides a low impedance which the operational amplifier could not provide because of the absence of local feedback around it.

Section 75 of the amplifier controls the amplifier by providing the voltage gain and feedback control. This section utilizes an LM833, operational amplifier 102. The input to operational amplifier 102 is provided by an input low pass filter and coupling capacitor section 77. This section prevents transient intermodulation distortion and increases amplifier stability by preventing output to input coupling at high frequencies. The coupling capacitor 104 is optional. It may be used or not, depending on the need. It prevents DC at the input from reaching the output.

The amplifier is equipped with safety devices such as the P channel and N channel MOSFET protectors. The P channel MOSFET safety protector 79 will protect the output devices 86, 88 in the event of an overload or a short. The N channel MOSFET protection device 81 is then for the same purpose.

Additional safety devices such as current limiters 83, 85 may be utilized as well. The diodes in protector sections 83, 85 limit the current in each MOSFET 86, 88 to approximately 7 amperes.

A bias current adjusting circuit 87 for the amplifier is also provided. The current to biasing diodes 73 may be adjusted simply by changing the value of the resistor 106.

Figure 6:
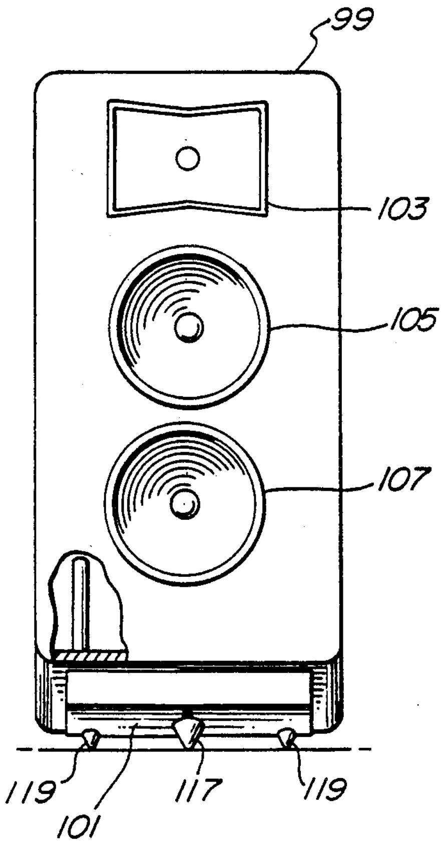
FIG. 6 is the front view with the grill removed illustrating an alternate embodiment of the drivers used in the present invention.

Referring now to FIG. 6, an alternate preferred embodiment for the driver arrangement according to the present invention is shown mounted on a front panel 99. The speaker housing is mounted on a bass 101. Mounted on front panel 99 is a compression driver or horn 103 which acts as the tweeter. Mounted in line below the horn 103 is a pair of 8 inch Dynaudio speakers 105, 107.

The utilization of a horn instead of a dome tweeter provides increased performance in the high frequency range. The horn arrangement preferred is a Renkus-Heinz CBH 1600 constant band width horn coupled to a Renkus-Heinz SSD 1801 compression driver. The equalization circuit of the present invention takes into consideration the frequency responses of the driver to provide the flat frequency response shown in FIG. 5 with the added advantages of increased dispersion and beamwidth with uniform power of response over the operating bandwidth and beamwidth.

An important improvement to the enclosure according to the present invention is the addition of a small 1½ inch ID tube 101 exiting the bottom of enclosure 99, to the atmosphere and entering into the cabinet at a point close to the heat sinks of the amplifiers. Utilization of this tube does not affect the bass performance of the enclosure but is found to decrease temperature of the heat sinks by 25° C. As a result of this venting tube, a maximum heat sink temperature of 62° C. was measured for a working embodiment of the present invention with the amplifiers operating at ⅓ RMS power at an ambient temperature of 25° C.

Figure 7:
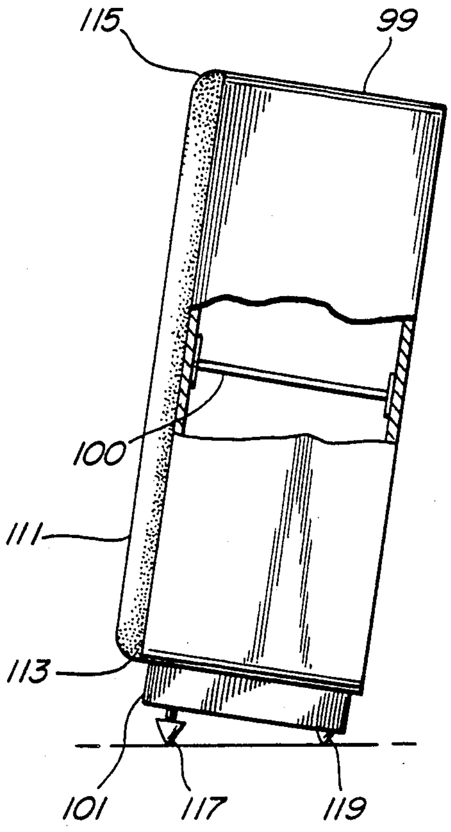
FIG. 7 is a side view, partly broken away showing several features of the enclosure according to the present invention.

Referring now to FIG. 7, the side view of the speaker enclosure 99, is illustrated with the grillcover on showing the rolloff of the edges 115 and 113. A broken away portion of the cabinet 99 shows the location of an aluminum plate 100 coupling the front baffleboard to the back panel to which is mounted to the power 18 panel transformer. This coupling perceptibly decreases the front panel resonance by considerably damping the front panel. Attached to the base 101 of the speaker enclosure 99, is a pair of feet 119, located at the back and a single height adjustable foot 117 located in front. This arrangement allows the listener to adjust the tilt of the speaker as desired.

Figure 8:
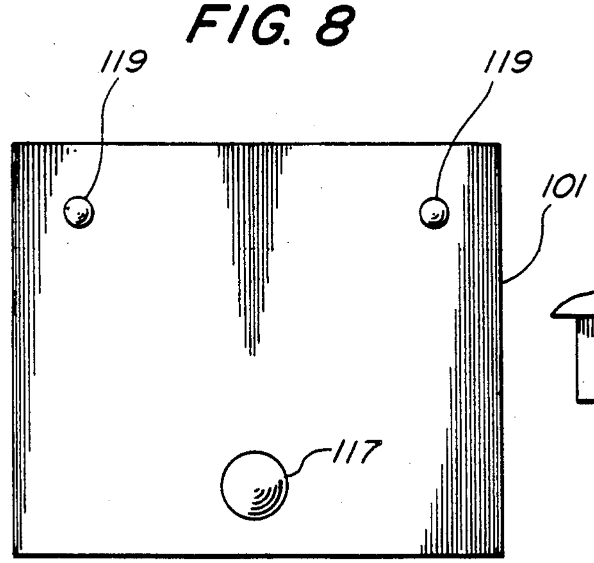
FIG. 8 is a bottom view of the speaker enclosure showing the adjustable feet.

FIG. 8 further illustrates the tripod arrangement of the adjustable feet 119 and 117. This tripod arrangement provides a very stable platform for the speaker with foot 117 being height adjustable. The degree of tilt required for listening at various distances is then provided.

Figure 9:
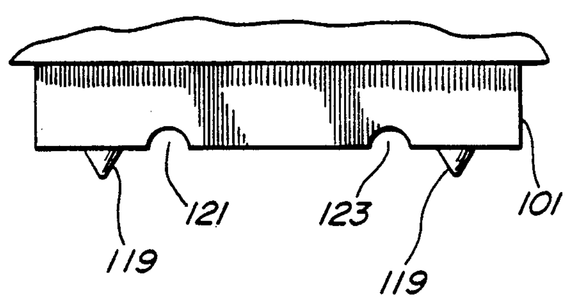
FIG. 9 is the back view of the base for the speaker enclosure showing the back feet and lead openings.

FIG. 9 illustrates the back end of the base 101 of the speaker enclosure as having fixed feet 119 thereon and a pair of aperatures 121 and 123 therein for allowing cable access into the speaker enclosure.

What is claimed is:

1. An active speaker system for reproducing audio signals in response to reception of line level signals, each system comprising at least one speaker enclosure, said speaker enclosure comprising;
- a high frequency driver mounted in said enclosure;
- a first power amplifier mounted inside said enclosure and connected to power said high frequency driver, said first power amplifier including a power output stage utilizing MOSFETs in a complimentary configuration;
- a bass and midrange driver mounted in said enclosure;
- a second power amplifier mounted inside said enclosure and connected to power said bass and midrange driver, said second power amplifier including a power output stage utilizing MOSFETs in a complimentary configuration;
- a first transconductance equalizer connected to the output stage of said first power amplifier for equalizing the gain at high frequencies, providing a different gain to the P and N channel MOSFET devices in the output stage to compensate for their unequal transconductance.
- a second transconductance equalizer connected to the output stage of said second power amplifier for equalizing the gain at high frequencies, providing a different gain to the P and N channel MOSFET devices in the output stage to compensate for their unequal transconductance;
- an electronic crossover mounted inside said enclosure and connected to receive said line level signals and provide bass, midrange, and high frequency band signals to said first and second power amplifier; and
- a power supply mounted inside said speaker enclosure for supplying power to said electronic crossover and said first and second power amplifier.

2. The active speaker system of claim 1 wherein said electronic crossover comprises a plurality of state variable filters for providing said high frequency band of signals and said midrange and bass frequency band of signals.

3. The active speaker system of claim 2 wherein the state variable filters of said electronic crossover each utilize a plurality of LM833 operational amplifiers.

4. The active speaker system of claim 1 wherein said electronic crossover comprises:
- a plurality of state variable filters for providing said high frequency band signals and said midrange and bass frequency band of signals;
- a bass equalizer circuit receiving said midrange and bass frequency signals from one of said state variable filters for producing equalized signals up to about 2000 Hz; and
- an all-pass circuit receiving said high frequency band of signals from one of said state variable filters for producing equalized signals and introducing a predetermined time delay into the signals from about 2000 Hz and up.

5. The active speaker system of claim 1 wherein said electronic crossover comprises:

three state variable filter circuits connected together, the first state variable circuit receiving the line level signal and supplying signals to the second and third state variable filter circuits;

a bass equalizer circuit receiving a signal from the second state variable filter circuit and outputting a signal having a frequency range up to about 2000 Hz said signal being equalized to the specific characteristics of said bass and midrange driver; and an all-pass circuit receiving a signal from the third state variable filter circuit for adding a predetermined time delay to the output signal having a frequency range of about 2000 Hz and up said signal being equalized to the specific characteristics of said high frequency driver.

6. The active speaker system of claim 5 wherein said electronic crossover further comprises:

a gain stage at the input to said first state variable filter; and a high frequency equalizing circuit at the input to said first state variable filter.

7. The active speaker system of claim 1 further comprising adjustable feet on the speaker enclosure of each system in tripod arrangement to provide for a stable platform and angle adjustment for listening at various distances.

8. The active speaker system of claim 1 wherein said MOSFETs are bolted directly to heat sinks to provide for maximum heat transfer.

9. The active speaker system of claim 1 wherein said first and second power amplifiers further comprise a plurality of output drivers having supply voltages less than ±50 volts for serving as a low impedance driver for said output stage.

10. The active speaker system of claim 9 wherein said first and second power amplifiers further comprise a plurality of biasing diodes for supplying said power output stage with stable biasing voltage.

11. The active speaker system of claim 1 wherein said first and second power amplifiers further comprise a controlling operational amplifier for providing voltage gain and feedback control to their respective power output stages.

12. The active speaker system of claim 11 wherein said first and second power amplifiers further comprise an input low-pass filter to prevent output to input signal coupling at high frequencies.

13. The active speaker system of claim 12 wherein said first and second power amplifiers further comprise:

a P channel MOSFET protector circuit to protect the power output devices in the event of an overload or short; and an N channel MOSFET protector circuit to protect the power output device in the event of an overload or short.

14. The active speaker system of claim 1 wherein said first and second power amplifiers further comprise:

a positive 18 volt regulator circuit for supplying a positive 18 volts to the amplifier and the crossover network; and a negative 18 volt regulator circuit for supplying a negative 18 volts to the amplifier and the crossover network.

15. The active speaker system of claim 1, further comprising a front panel to which said drivers are mounted and an aluminum plate connected to the front panel and to the power supply inside the enclosure to provide rigidity to the speaker enclosure and considerably reduce front panel resonance.

16. The active speaker system of claim 1 wherein said enclosure comprises:

rounded corners at the face of said enclosure on which said drivers are mounted; and a grill covering said drivers which has rounded corners and edges that roll off into said enclosure sides.

17. The active speaker system of claim 16 further comprising an enclosure having a port therein near the top of the enclosure to allow hot air to be pumped out by the drivers.

18. The active speaker system of claim 1 wherein said high frequency driver comprises a horn.

19. The active speaker system of claim 1 further comprising a small diameter tube located at the bottom of the enclosure and running into the enclosure for ventilation.

20. A power amplifier for audio frequency signals comprising:

at least one power output stage utilizing MOSFETS in a complimentary configuration; and transconductance equalizers for equalizing the gain at high frequencies of said MOSFET output stage, providing a different gain to the P and N channel MOSFET output devices to compensate for their unequal transconductance.

21. An improved power amplifier for audio frequency signals comprising:

at least one power output stage utilizing MOSFETS in a voltage gain configuration with their drains connected together;

a heat sink means for said MOSFETs, said MOSFETs being mounted directly to said heat sink means without insulation therebetween; and transconductance equalizer means for equalizing the gain of said MOSFETs in said power output stage.

22. The power amplifier of claim 21 further comprising a plurality of output drivers having supply voltages less than ±50 volts for serving as a low impedance driver for said output stage.

23. The power amplifier of claim 22 further comprising a plurality of biasing diodes for supplying said power output stage with stable biasing voltage.

24. The power amplifier of claim 21 further comprising a control operational amplifier for providing voltage gain and feedback control to the power output stage.

25. The power amplifier of claim 24 further comprising an input low-pass filter to prevent output to input signal coupling at high frequencies.

26. The power amplifier of claim 25 further comprising:

a P channel MOSFET protector circuit to protect the power output devices in the event of an overload or short; and an N channel MOSFET protector circuit to protect the power output device in the event of an overload or short.

27. The power amplifier of claim 21 further comprising:

a positive 18 volt regulator circuit for supplying a positive 18 volts to the amplifier; and a negative 18 volt regulator circuit for supplying a negative 18 volts to the amplifier.

* * * * *